US010605590B2

(12) United States Patent
Nguyen et al.

(10) Patent No.: US 10,605,590 B2
(45) Date of Patent: *Mar. 31, 2020

(54) FIBER OPTIC VOLTAGE CONDITIONING

(71) Applicant: iSenseCloud, Inc., San Jose, CA (US)

(72) Inventors: An-Dien Nguyen, Fremont, CA (US);
An H. Nguyen, Fremont, CA (US)

(73) Assignee: iSenseCloud, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,320

(22) Filed: Jun. 26, 2019

(65) Prior Publication Data

US 2019/0339065 A1 Nov. 7, 2019

Related U.S. Application Data

(63) Continuation of application No. 16/017,737, filed on Jun. 25, 2018, now Pat. No. 10,378,884, which is a
(Continued)

(51) Int. Cl.
| | |
|---|---|
| *H01S 5/0687* | (2006.01) |
| *G01B 11/16* | (2006.01) |
| *H04B 10/572* | (2013.01) |
| *H01S 5/0683* | (2006.01) |
| *H01S 5/06* | (2006.01) |
| *H01S 5/062* | (2006.01) |
| *H01S 5/024* | (2006.01) |

(Continued)

(52) U.S. Cl.
CPC .......... *G01B 11/165* (2013.01); *H01S 5/0612* (2013.01); *H01S 5/0622* (2013.01); *H01S 5/0687* (2013.01); *H01S 5/06837* (2013.01); *H04B 10/572* (2013.01); *H01S 5/02415* (2013.01); *H01S 5/0617* (2013.01); *H01S 5/06804* (2013.01); *H01S 5/06808* (2013.01); *H01S 5/4087* (2013.01)

(58) Field of Classification Search
CPC .. H01S 5/0612; H01S 5/0622; H01S 5/06837; H01S 5/0687; G01B 11/165
See application file for complete search history.

(56) References Cited

U.S. PATENT DOCUMENTS

| | | | |
|---|---|---|---|
| 10,033,153 B1 * | 7/2018 | Nguyen | H01S 5/0612 |
| 10,378,884 B1 * | 8/2019 | Nguyen | G01B 11/165 |

* cited by examiner

*Primary Examiner* — Michael Carter
(74) *Attorney, Agent, or Firm* — The Webostad Firm, a P.C.

(57) ABSTRACT

A fiber optic voltage conditioner, and method therefor, generally relate to voltage conditioning. In such a fiber optic voltage conditioner, there is a laser, and an optical circulator is coupled to receive a light signal from the laser. A controller is coupled to the laser and is configured to generate first control information for wavelength-drift control of the laser. A data acquisition module is coupled to the controller and is configured to generate second control information for the controller for adjustment of the first control information. A photodetector is coupled to the optical circulator to receive a returned optical signal and is coupled to the data acquisition module to provide an analog output signal thereto. The photodetector is configured to generate the analog output signal responsive to the returned optical signal. The data acquisition module is configured to generate the second control information using the analog output signal.

17 Claims, 7 Drawing Sheets

Related U.S. Application Data continuation of application No. 14/814,355, filed on Jul. 30, 2015, now Pat. No. 10,033,153.

(60) Provisional application No. 62/062,429, filed on Oct. 10, 2014, provisional application No. 62/031,790, filed on Jul. 31, 2014.

(51) Int. Cl.
*H01S 5/068* (2006.01)
*H01S 5/40* (2006.01)

FIBER OPTIC VOLTAGE CONDITIONING

CROSS-REFERENCE TO RELATED APPLICATIONS

This application is a continuation of and claims benefit of priority to U.S. patent application Ser. No. 16/017,737, filed Jun. 25, 2018, which is a continuation of U.S. patent application Ser. No. 14/814,355, filed Jul. 30, 2015 (now U.S. Pat. No. 10,033,153 B1), which claims the benefit under 35 U.S.C. section 119(e) of U.S. Provisional Application No. 62/062,429, filed Oct. 10, 2014, and U.S. Provisional Application No. 62/031,790, filed Jul. 31, 2014, and the entirety of each of the aforementioned provisional and nonprovisional applications is hereby incorporated by reference herein for all purposes consistent herewith.

STATEMENT OF GOVERNMENT INTEREST

The technical feasibility of using claimed technology with an energy harvester for helicopter rotors was demonstrated with government support under Phase I SBIR contract number N68335-13-C-0318, "Energy Harvesting, Wireless Structural Health Monitoring for Helicopter Rotors". Accordingly, the technology claimed herein existed before entry into the SBIR contract; however, the U.S. Government may have certain rights in other technology, if any, developed pursuant to the terms of such Phase I SBIR contract.

FIELD

The following description relates generally to voltage, including signal, conditioning. More particularly, the following description relates to fiber optic voltage conditioning for sensor integration.

INTRODUCTION

For real-time structural health monitoring, conventional strain measurement instrumentation may be used with conventional voltage or signal conditioners. However, such conventional signal conditioners may not have sufficient performance for some structural health monitoring applications. Along those lines, optical sensors may be used for some structural health monitoring applications involving such performance demands. Use of optical sensors may involve fiber optic voltage conditioning. However, conventional fiber optic voltage conditioning may be too expensive or too heavy for some real-time structural health monitoring applications.

BRIEF SUMMARY

A fiber optic voltage conditioner generally relates to voltage conditioning. In such a fiber optic voltage conditioner, there is a laser, and an optical circulator is coupled to receive a light signal from the laser. A controller is coupled to the laser and is configured to generate first control information for wavelength-drift control of the laser. A data acquisition module is coupled to the controller and is configured to generate second control information for the controller for adjustment of the first control information. A photodetector is coupled to the optical circulator to receive a returned optical signal and is coupled to the data acquisition module to provide an analog output signal thereto. The photodetector is configured to generate the analog output signal responsive to the returned optical signal. The data acquisition module is configured to generate the second control information using the analog output signal.

A method generally relates to fiber optic voltage conditioning. In such a method, a light signal is generated with a laser. The light signal is received by an optical circulator. First control information is generated by a controller coupled to the laser for wavelength-drift control of the laser. Second control information is generated by a data acquisition module coupled to the controller. The first control information is adjusted by the controller responsive to the second control information. A returned optical signal is received by a photodetector coupled to the optical circulator. An analog output signal is generated by the photodetector responsive to the returned optical signal. The generating by the data acquisition module of the second control information is for the analog output signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
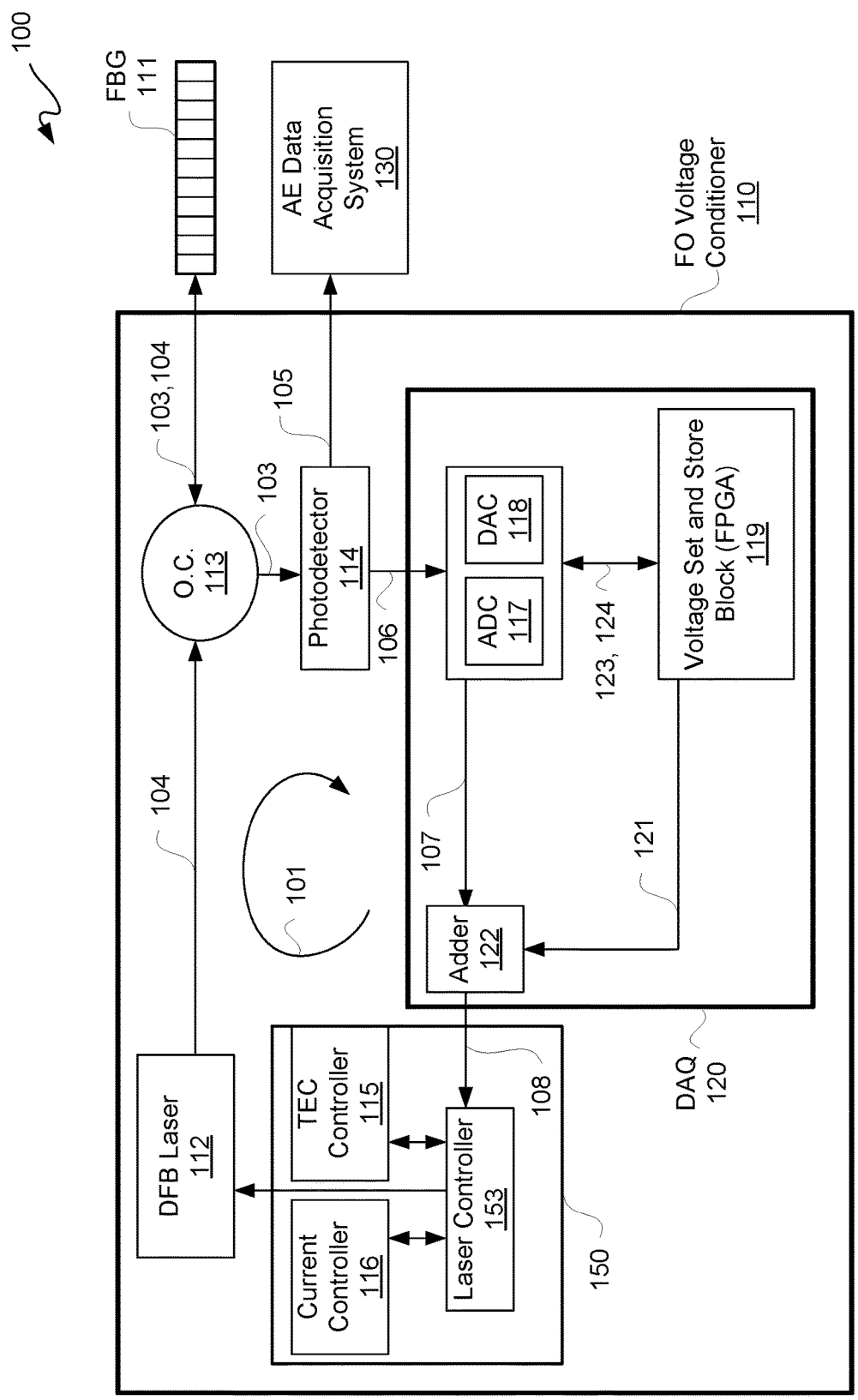
FIG. 1 is a block diagram depicting an exemplary single-channel laser tracking-based fiber optic voltage conditioning ("FOVC") system.

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention. In other instances, well-known features have not been described in detail so as not to obscure the invention. For ease of illustration, the same number labels are used in different diagrams to refer to the same items; however, in alternative embodiments the items may be different. Furthermore, though particular dimensions, parameters, and other numerical details are described herein for purposes of clarity by way of example, it should be understood that the scope of the description is not limited to these particular numerical examples as other values may be used.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

A structural health monitoring system capable of measuring load, vibration, and/or acoustic emission ("AE") responses corresponding to damages occurring in materials and/or structures is described. Such a sensing system may include a fiber Bragg grating ("FBG") sensor array interrogated by laser-based detection system. Such a laser-based detection system in an example may be a miniaturized stand-alone laser-based detection system.

In an implementation, such a structural health monitoring system may be combined with a multichannel wireless data acquisition node and high-performance energy harvesters, the feasibility of which was demonstrated under the above-identified Phase I SBIR contract. Along those lines, in an example implementation, a load and damage monitoring system for helicopter blades was developed using such a low weight, high-speed structural health monitoring ("SHM") system, as described in additional detail below. Such additional description of such SHM system with examples of helicopter blades, though wind turbine blades or other rotating objects may be used, using fiber optics ("FO"), including without limitation fiber optic acoustic emission ("FOAE") monitoring is provided; however, it should be understood that such SHM system is not limited to the application of monitoring helicopter blades, but may be used in other applications. Along those lines, such FOAE monitoring may be used to monitor for corrosion damage, metal fatigue, composite damage, concrete micro-fracture, wire break, and/or pipe damage, among other examples.

FIG. 1 is a block diagram depicting an exemplary single-channel laser tracking-based fiber optic voltage conditioning system 100. In order to provide voltage conditioning for acoustic emissions ("AEs") measurements, an open/closed loop control 101 of fiber optic voltage conditioner ("FOVC") 110 of fiber optic voltage conditioning system 100 may be used to actively track a laser to Bragg wavelength of an FBG sensor.

A function of laser tracking-based FOVC 110 may be to provide fiber optic voltage conditioning of returned optical signal 103 coupled to FBG sensors (collectively and singly "FBG sensor") 111 via a fiber optic cable or line, as described below in additional detail. Along those lines, a multifunction fiber optic sensor, such as fiber Bragg grating sensor, may be used. For AE measurements, using a fiber Bragg grating sensor in a fiber optic housing, an entire sensing area can be bonded directly to a surface of a structure ("measurement surface") such as with a permanent epoxy or other bonding material. The direct bonding of a bare fiber to a measurement surface may provide a high-level of stress wave coupling from such measurement surface to a sensing area.

However, over time such bonding material may result in local stress along such Bragg grating sensor, such as along a grating length for example, and this may lead to creation of an unstable optical cavity formed by multiple gratings, such as along such grating length for example. These optical cavities may negatively affect FOAE sensor performance by changing the slope of a Bragg reflection spectrum and/or increasing Fabry-Perot noise. To address this issue, an overhanging ridge configuration may be used, where a grating under tension may be used for hanging over two stand-offs bonded to a structure's surface to address the above-described problem, such as for AE and/or strain sensing. Moreover, for an overhanging ridge configuration, a grating may be used for hanging over shear wave-coupling gel, on either or both sides thereof, to provide a flexible bonding to a structure's surface to address the above-described problem, such as for AE and/or temperature sensing. Optionally, a package sensor multiplexing two or more FBG sensors on the same package with different Bragg wavelengths installed can be multiplexed in serial or parallel. Such a package sensor may be used for AE, strain, and/or temperature sensing. Moreover, optionally a multiplexed-multi-sensing package sensor may be used. For example, two or more different types of sensors (e.g., AE/strain and AE/temperature) can be multiplexed on the same package for multi-sensing.

Another function of such laser tracking-based FOVC 110 may be to convert returned optical signal 103 from FBG sensor 111 to an AC voltage analog output 105 that may directly interface with conventional AE instrumentation, which is illustratively depicted as AE data acquisition system 130. An analog signal output 105 of FOVC 110 may resemble that of a piezo-electric sensor used in conventional AE measurements, facilitating sensor "drop in replacement".

Along those lines, conventional piezo-electric sensors/preamplifier signal conditioners can be completely replaced with a combination of FBG sensor 111 and FOVC 110 as described herein without changing existing AE software and electronics of conventional AE data acquisition systems, such as AE data acquisition system 130 for example, leading to significant cost saving through minimizing additional hardware/software installation. In other words, a high-frequency, high-gain photodetector output 105 carrying a high frequency signal may be interfaced directly to an analog input of a conventional AE data acquisition system 130, such as a Mistras PCI-2 DAQ board from Mistras Group, Inc. of Princeton Junction, N.J., for example.

Light 104, which may be from a compact, commercially available distributed feedback ("DFB") laser or other laser 112, may be passed via an optical circulator 113 to an FBG sensor 111. A returned optical signal 103 from FBG sensor 111 passing through optical circulator 113 may be routed to a photodetector 114. Current control 116, which may be separate from or part of DFB laser 112, may be initially set at a midrange value between a lasing threshold and a maximum current limit, and a thermoelectric cooler ("TEC") control 115, which may be separate from or part of DFB laser 112, may be tuned to move laser wavelength to a mid-reflection point ("V REF") of a Bragg wavelength of FBG sensor 111.

With laser current and TEC control voltages settled at initial set points, namely V TEC SET and V CUR SET 121, laser wavelength may be locked to a mid-reflection point of FBG sensor 111 using simultaneous TEC and current tracking through a closed loop 101 proportional-integral-derivative ("PID") feedback control.

For adjustment for real-time laser tracking control, a chip-based data acquisition ("DAQ") board 120, such as an FPGA-based or other System-on-Chip-based ("SoC-based") circuit board, may be used to record at least one of a low-gain and/or low-frequency of photodetector output signal 106, namely as associated with an analog input to analog-to-digital converter ("ADC") 117 and to generate a PID control signal 107, namely as associated with a digital output of ADC 117.

By "low-gain" and "low-frequency", it is generally meant an analog output signal being below both a threshold gain and a threshold frequency, respectively, where such thresholds represent an external environmental change and/or perturbation, including without limitation a change in one or more of temperature, strain, pressure, and/or stress of a structure under test, including a structure being monitored, as sensed by one or more FGB sensors coupled to one or more optical fibers. Accordingly, such thresholds may vary from application-to-application depending upon the type of structure being tested, as well as use of such structure.

An analog output signal 106 of photodetector 114 may be converted to a digital signal by ADC 117, and output of ADC 117 may feed an input of a voltage set and store block 119. An output of voltage set and store block 119 may feed an input of DAC 118 to provide an analog PID control signal 107. PID control signal 107 may include a PID current error ("CUR ERR") signal and a PID TEC error ("ERR") signal. PID control signal 107 may be output from DAC 118.

For purposes of clarity by way of example and not limitation, it shall be assumed that an FPGA is used to set and store voltages; however, in another implementation another type of SoC may be used, including without limitation an ASSP, ASIC, or other IC. Along those lines, voltage set and store block ("FPGA") 119 may be used to set and store a laser current voltage and a TEC control voltage, namely V TEC SET and V CUR SET 121, and FPGA 119 may be used to store a mid-reflection point V REF of a Bragg wavelength of FBG sensor 111. FPGA 119 may be coupled to receive a digital output 123 from ADC 117, where such digital output 123 is a conversion of an analog photodetector output signal 106. FPGA 119 may be configured to generate and store TEC and laser current error voltages, namely a V TEC ERR and a V CUR ERR, using such digital output 123 received. FPGA 119 may provide a digital PID control signal 124, where such digital PID control signal includes a V CUR ERR signal and a V TEC ERR signal, to DAC 118, and DAC 118 may convert such digital PID control signal 124, namely a V TEC ERR signal and a V CUR ERR signal, to analog PID control signal 107 having analog PID CUR ERR and PID TEC ERR signals.

PID CUR and TEC error signals from PID control 107 may be correspondingly added to CUR and TEC set voltages 121 by adder 122, and respective sums 108 output from adder 122 may be fed into a controller 150 for adjustment of control information provided to laser 112. In this example, for purposes of clarity and not limitation controller 150 is broken out into three controllers or modules, namely a laser controller 153 coupled to a current controller 116 and a TEC controller 115. However, in another implementation, current controller 116 and/or TEC controller 115 may be part of a laser, such as DFB laser 112 for example. Sums 108 may be used together to compensate for drift of a Bragg wavelength, such as due to external environmental changes and/or perturbation including without limitation changes in one or more of temperature, strain, pressure, and/or stress, by actively tuning laser wavelength responsive to such current and TEC control.

In this example, both laser TEC and current are used simultaneously to compensate for FBG wavelength drift from DC up to approximately 20 kHz for photodetector output signal 106. TEC tracking may be provided by changing temperature of DFB laser 112 via TEC control 115 to compensate for FBG sensor 111 wavelength drift caused by environmental changes. While providing large dynamic range, such as for example approximately several thousand microstrains for strain monitoring, TEC compensation may be slow, with a maximum response time in the order of seconds or longer.

In this example, fast, such as for example a few Hz to 20 kHz or higher, real time compensation may not be possible with TEC tracking. Along those lines, laser current compensation, as described herein, may be used with a much higher response time, possibly up to approximately 20 kHz or higher, subject to limitations of response time of electronics of laser controller 153, and such laser current compensation may be used simultaneously with TEC tracking. Tracking by changing laser injection current may cause changes in both laser wavelengths and intensity, although with much more limited dynamic range, such as for example approximately several hundred microstrains for dynamic strain tracking. For larger dynamic strain monitoring, such as more than approximately a thousand microstrains, commercially available distributed Bragg reflector ("DBR") lasers can be used in place of DFB lasers. However, it should be appreciated that using TEC and current tracking in combination provides extended dynamic range and fast response for laser tracking.

Long-distance AE measurement using a laser-based FBG interrogation may be subject to presence of high amounts of optical noise associated with the Fabry-Perot effect generated by an optical cavity created by two or more reflective mirrors. By "interrogation," it is generally meant providing a light signal to an optical sensor coupled to a material or structure under test and obtaining a light signal in return from such optical sensor to obtain information therefrom regarding such material or structure under test. A Bragg grating itself may be considered a highly reflective mirror. In the presence of another reflective surface from an optical component, such as for example an optical circulator or a scattering center such as a local defect present in a long optical fiber, unstable, unwanted constructive optical interferences can be generated due to laser coherence. Accordingly such interferences may contribute to increased AE background noise, and as a consequence can significantly reduce a signal-to-noise ratio ("SNR") in AE measurements.

To suppress this optical noise, a combination of circulators and optical isolators between reflection and/or scattering surfaces may be used to provide unidirectional optical paths and avoid bidirectional optical paths between any two reflective optical components, such as described below in additional detail.

Figure 2A:
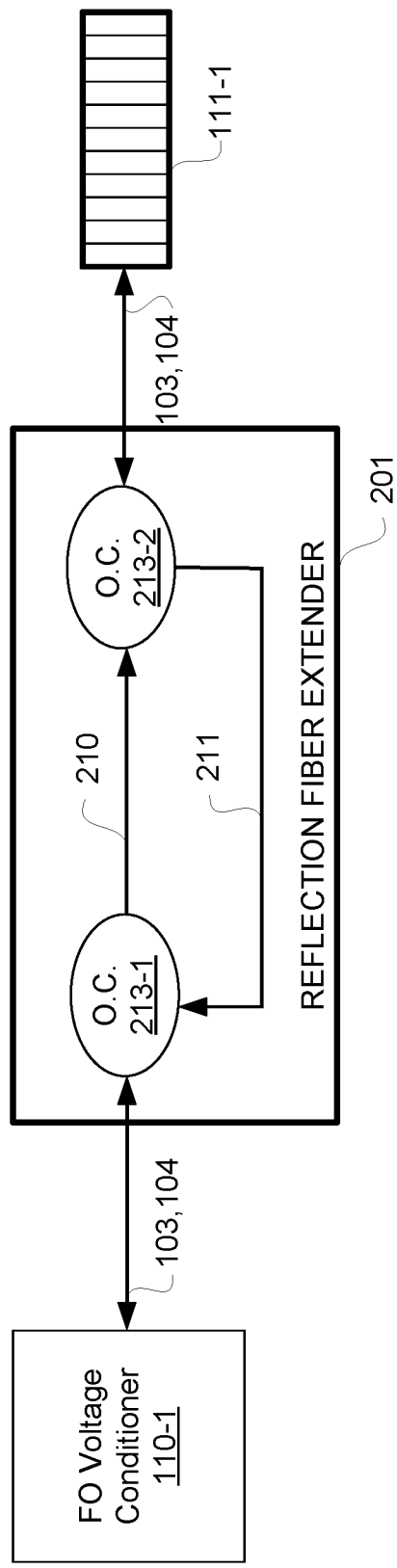
FIGS. 2A and 2B are block diagrams depicting an exemplary reflection fiber extender system and an exemplary transmission fiber extender system, respectively.
Figure 2B:
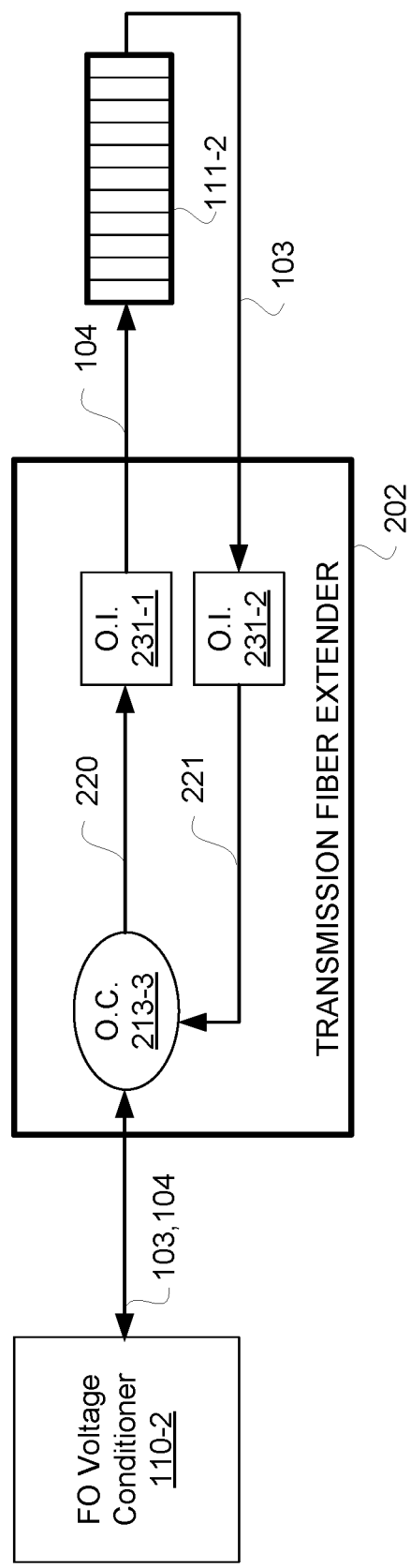

FIG. 2A is a block diagram depicting an exemplary reflection fiber extender system 200A, and FIG. 2B is a block diagram depicting an exemplary transmission fiber extender system 200B. One or more instances of each of fiber extender systems 200A and 200B may be used separately from one another or a combination of such systems may be used. Accordingly, reflection fiber extender system 200A and transmission fiber extender system 200B are generally referred to hereinbelow as "fiber extender system 200", and correspondingly reference to either or both FIGS. 2A and 2B hereinbelow is generally to "FIG. 2".

Fiber extender system 200 may include a reflection fiber extender 201 coupled between an FOVC 110-1 and a FBG sensor 111-1 and/or a transmission fiber extender 202 coupled between an FOVC 110-2 and a FBG sensor 111-2. Fiber extender system 200 may be used for long distance AE measurements.

Fiber extenders 201 and 202 may respectively be used in a reflection and a transmission mode. Reflection fiber extender 201 may include two long optical fibers 210 and 211 coupled between optical circulators 213-1 and 213-2. Transmission fiber extender 202 may include a long optical fiber 220 coupled between an optical circulator 213-3 and an optical isolator 231-1, and may include another long optical fiber 221 coupled between an optical isolator 231-2 and optical circulator 213-3.

Along those lines for a reflection mode, light 104 passed through circulator 113 of FOVC 110-1 may be passed through circulator 213-1 for optical fiber 210. Optical fiber 210 may conduct light 104 to circulator 213-2 for output therefrom to FBG sensor 111-1. Responsive to wavelengths in such light 104, including without limitation isolating one or more perturbations in such light, a returned optical signal 103 from FBG sensor 111-1 may be provided to circulator 213-2. Along those lines, FBG sensor 111-1 may reflect one or more wavelengths in such light 104 for generating returned optical signal 103, and FBG sensor 111-1 may transmit one or more other wavelengths in such light 104 for effectively blocking or filtering out such transmitted wavelengths from being included in returned optical signal 103. Circulator 213-2 may provide returned optical signal 103 to circulator 213-1 via optical fiber 211. Lastly, circulator 213-1 may provide such returned optical signal 103 to circulator 113 of FOVC 110-1 for processing as previously described herein.

For a transmission mode, light 104 passed through circulator 113 of FOVC 110-2 may be passed through circulator 213-3 for optical fiber 220. Optical fiber 220 may conduct light 104 to optical isolator 231-1 for output therefrom to FBG sensor 111-2. Responsive to wavelengths in such light 104, including without limitation isolating one or more perturbations in such light, a returned optical signal 103 from FBG sensor 111-2 may be provided to optical isolator 231-2. Along those lines, FBG sensor 111-2 may reflect or block one or more wavelengths in such light 104 for effectively blocking or filtering out same from a returned optical signal 103, and FBG sensor 111-2 may transmit one or more other wavelengths in such light 104 for generating returned optical signal 103. Optical isolator 231-2 may provide returned optical signal 103 to circulator 213-3 via optical fiber 221. Lastly, circulator 213-3 may provide such returned optical signal 103 to circulator 113 of FOVC 110-2 for processing as previously described herein.

Figure 3:
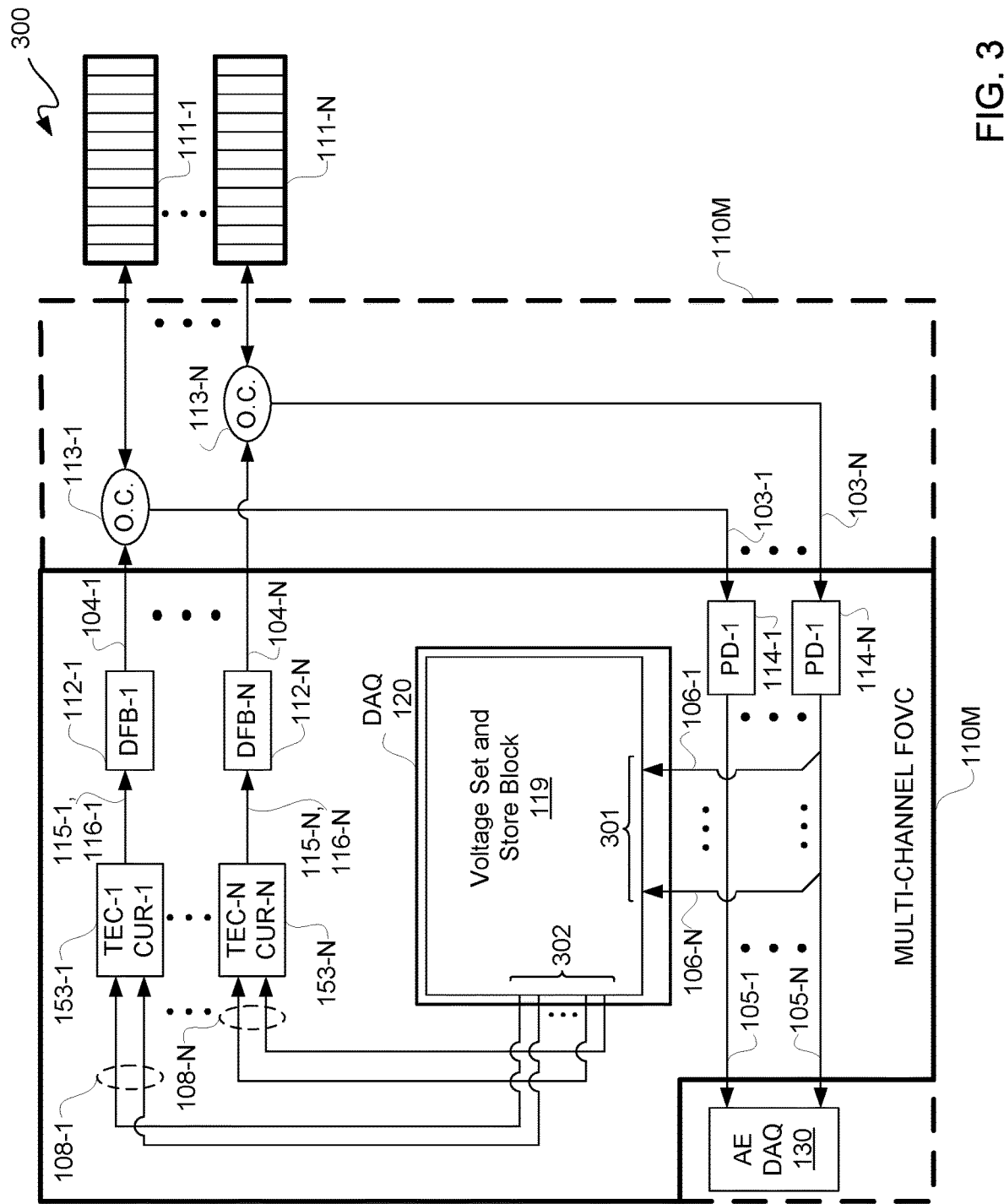
FIG. 3 is a block diagram depicting an exemplary multichannel FOVC system.

FIG. 3 is a block diagram depicting an exemplary multichannel FOVC system 300. Multichannel FOVC system 300 is further described with simultaneous reference to FIGS. 1 through 3.

In multichannel FOVC system 300, an N-channel FOVC 110M is respectively coupled to FBG sensors 111-1 through 111-N via corresponding optical circulators 113-1 through 113-N, for N a positive integer greater than one. FBG sensors 111-1 through 111-N may be respective discrete FOAE sensors or an array thereof.

DFB1 through DFBN lasers 112-1 through 112-N and corresponding photodetectors ("PD") PD1 114-1 through PDN 114-N may be respectively coupled to optical circulators 113-1 through 113-N. Each of DFB lasers 112-1 through 112-N may deliver corresponding laser lights 104-1 through 104-N respectively into Bragg grating sensors 111-1 through 111-N via corresponding circulators 113-1 through 113-N. Circulators 113-1 through 113-N may then be used to pass corresponding returned optical signals 103-1 through 103-N respectively from sensors 111-1 through 111-N on a per channel basis. Returned optical signals 103-1 through 103-N may be respectively provided onto photodetectors 114-1 through 114-N.

Each of the outputs of photodetectors 114-1 through 114-N, which may be implemented in an example implementation as photodiodes ("PD") PD1 through PDN, may be split into two sections, namely signals 106-1 through 106-N and signals 105-1 through 105-N. One group, namely a low frequency signal output group of signals 106-1 through 106-N, may be input into an analog input interface 301, such as respective analog input ports for example, of an FPGA-based data acquisition system 120 for laser tracking control generation as previously described herein. Another group, namely a high frequency signal output group of signals 105-1 through 105-N, may be input to a conventional multichannel AE DAQ system 130 for AE measurement.

Even though an FPGA 119 is used as described herein for DAQ 120, another type of SoC, an ASSP, an ASIC, or other VLSI type of integrated circuit device may be used instead of FPGA 119. However, for purposes of clarity and not limitation, it shall be assumed that an FPGA 119 is used. Furthermore, DAC 120 may exist in a single integrated circuit device, whether such device is a monolithic integrated circuit or an integrated circuit formed of two or more integrated circuit dies packaged together. An FPGA 119 may have sufficient resources for integration of one or more ADCs 117, one or more DACs 118, and/or one or more adders 122 therein for providing a multichannel FOVC 110M. However, an FPGA may lack sufficient analog resources, and so a separate analog chip, such as for providing digital-to-analog conversions, may be used.

In this example, FOVC 110M includes a DAQ 120 having an FPGA 119 configured for inputs 1 through N of an analog input interface 301 ("inputs 301") and outputs 1 through 2N of an analog output interface 302 ("outputs 302"), for example separate analog output ports. Inputs 301 may correspond to a group of signals 106-1 through 106-N. Pairs of outputs 108-1 through 108-N of outputs 302 may respectively be provided to laser controllers 153-1 through 153-N. Laser controllers 153-1 through 153-N may provide respective pairs of TEC and current control signals 115-1, 116-1 through 115-N, 116-N to DFBs 112-1 through 112-N, respectively. For purposes of clarity by way of example and not limitation, laser controllers 153-1 through 153-N are illustratively depicted as including corresponding pairs of current and TEC controllers, which were illustratively depicted as separate controllers 116 and 115, respectively, in FIG. 1 for purposes of clarity. However, it should be understood that controllers 115 and 116 may be incorporated into a laser controller 153.

Accordingly, for purposes of scaling an FOVC 110, it should be appreciated that a single FPGA 119 may be used by a DAQ 120 configured to support N channels. In this example, FOVC 110M does not include optical circulators 113-1 through 113-N; however, in another configuration, FOVC 110M may include optical circulators 113-1 through 113-N.

Generally, FPGA 119 generates respective sets, such as pairs for example, of TEC and current control signals 108-1 through 108-N via analog output ports 302 of DAQ 120, and such respective sets of TEC and current control signals 108-1 through 108-N may be used to provide corresponding pairs of TEC control and current control signals 115-1, 116-1 through 115-N, 116-N to respectively lock DFB lasers 112-1 through 112-N to their respective FBG sensors 111-1 through 111-N by adding respective error signals. Such respective error signals may be generated from FPGA 119 generated PID control to provide current and TEC set points via digital summing as previously described herein, though on a per-channel basis in this example of FOVC 110M. For long distance measurements, N fiber extenders, whether all transmission fiber extenders 202, all reflection fiber extenders 201, or a combination of fiber extenders 201 and 202, as previously described with reference to FIG. 2 may be used in conjunction with multichannel FOVC 110M.

Figure 4A:
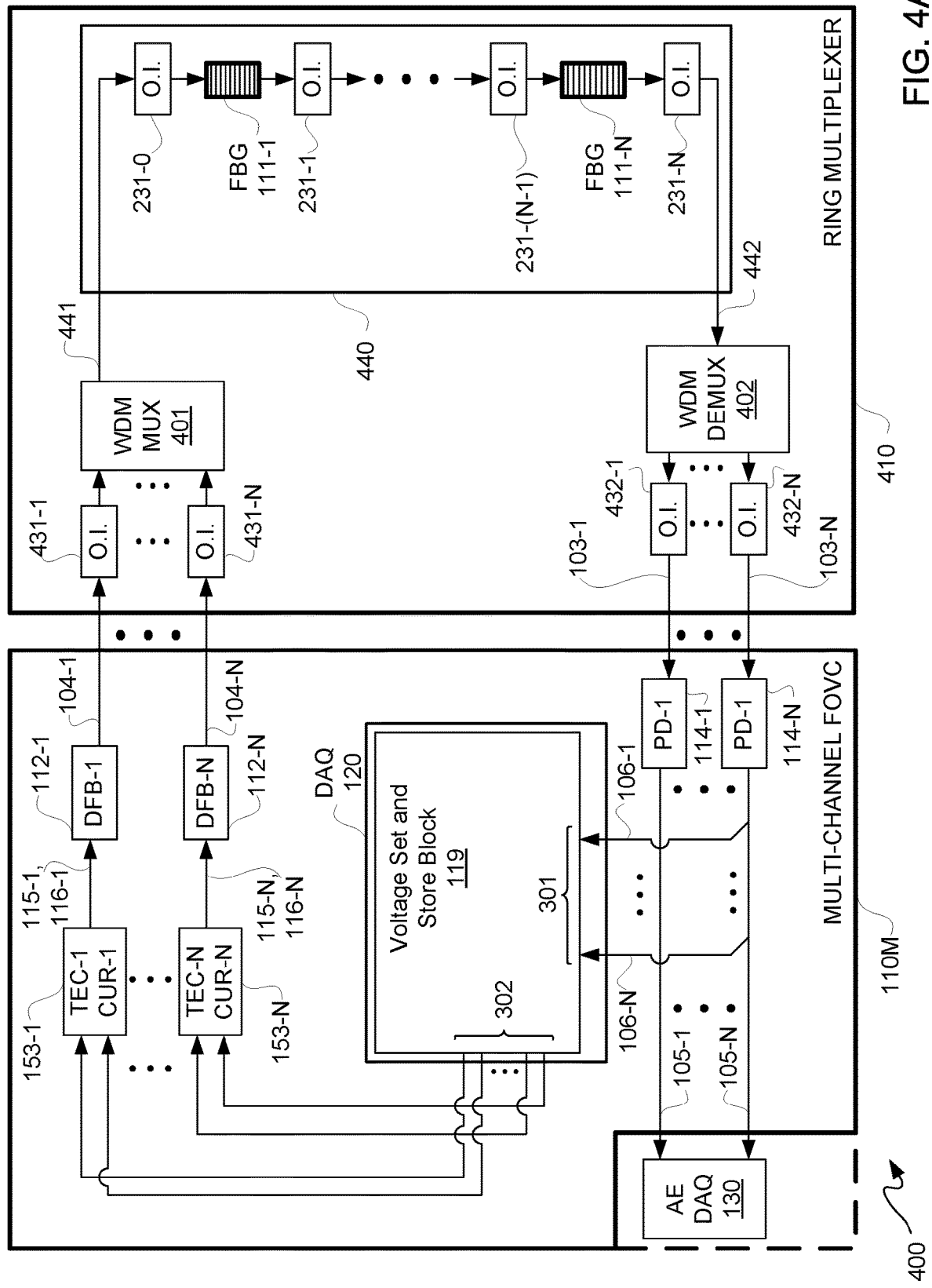
FIG. 4A is a block diagram depicting an exemplary wavelength-multiplexed multichannel FOVC system in a ring configuration.

FIG. 4A is a block diagram depicting an exemplary wavelength-multiplexed multichannel FOVC system 400 having a ring configuration. Wavelength-multiplexed multichannel FOVC system 400 includes FOVC 110M of FIG. 3, without optical circulators 113-1 through 113-N, coupled to a ring multiplexer 410. Wavelength-multiplexed multichannel FOVC system 400 may be used for wavelength-multiplexed N-channel fiber optic voltage conditioning for FOAE measurement configured in a ring topology.

FBG sensors 111-1 through 111-N are FOAE sensors with Bragg reflection wavelengths for a wavelength range, which may vary from application-to-application. For example, such wavelengths may be in a range of approximately 1510 nm to 1650 nm. For purposes of clarity by way of example and not limitation, it shall be assumed that such wavelengths include 1510 nm and 1650 nm.

FOVC 110M is coupled as previously described to provide laser light 104-1 through 104-N and to receive returned optical signals 103-1 through 103-N. Accordingly, description of FOVC 110M is generally not repeated for purposes of clarity and not limitation.

In a ring topology, FBG sensors 111-1 through 111-N may be connected in series, and a ring multiplexer 410 may be used to provide laser tracking in a transmission mode. In a ring multiplexer 410, a wavelength division multiplexing multiplexer ("WDM mux") 401 may be configured to multiplex N DFB laser light outputs 104-1 through 104-N into a single mode multiplexed optical signal 441 for providing to a single-mode telecommunication fiber 440.

Telecommunication fiber 440 may include N FBG sensors 111-1 through 111-N coupled in series. Telecommunication fiber 440 may include optical isolators 231-0 and 231-N respectively bracketing such series of FBG sensors 111-1 through 111-N, and may include optical isolators 231-1 through 231-(N−1) respectively inserted between each adjacent pair of FBG sensors of such series of FBG sensors 111-1 through 111-N. Optionally, an optical isolator 231-N may be separated out to be more proximate to an input of a WDM demultiplexer ("demux") 402 of ring multiplexer 410 for providing a returned multiplexed optical signal 442 output from telecommunication fiber 440 after processing such single mode multiplexed optical signal 441.

More generally, an optical isolator 231 may be inserted between each optical component and/or FBG sensor to provide unidirectional optical paths, namely overall a single unidirectional ring path of ring multiplexer 410, and to suppress cavity-like optical noises. Along those lines, input optical isolators 431-1 through 431-N of ring multiplexer 410 may respectively be coupled to receive laser lights 104-1 through 104-N and to provide optically isolated version thereof as respective inputs to WDM mux 401, and output optical isolators 432-1 through 432-N of ring multiplexer 410 may respectively be coupled to receive demultiplexed returned optical signals 103-1 through 103-N from WDM demux 402 to generate optically isolated version thereof as respective inputs to photodetectors of FOVC 110M as previously described.

WDM demux 402 of ring multiplexer 410 may be coupled to receive returned multiplexed optical signal 442 and configured to demultiplex such optical signal into transmitted signals passed through FBG sensors and optical isolators onto N separate photodiodes 114-1 through 114-N, as previously described.

Figure 4B:
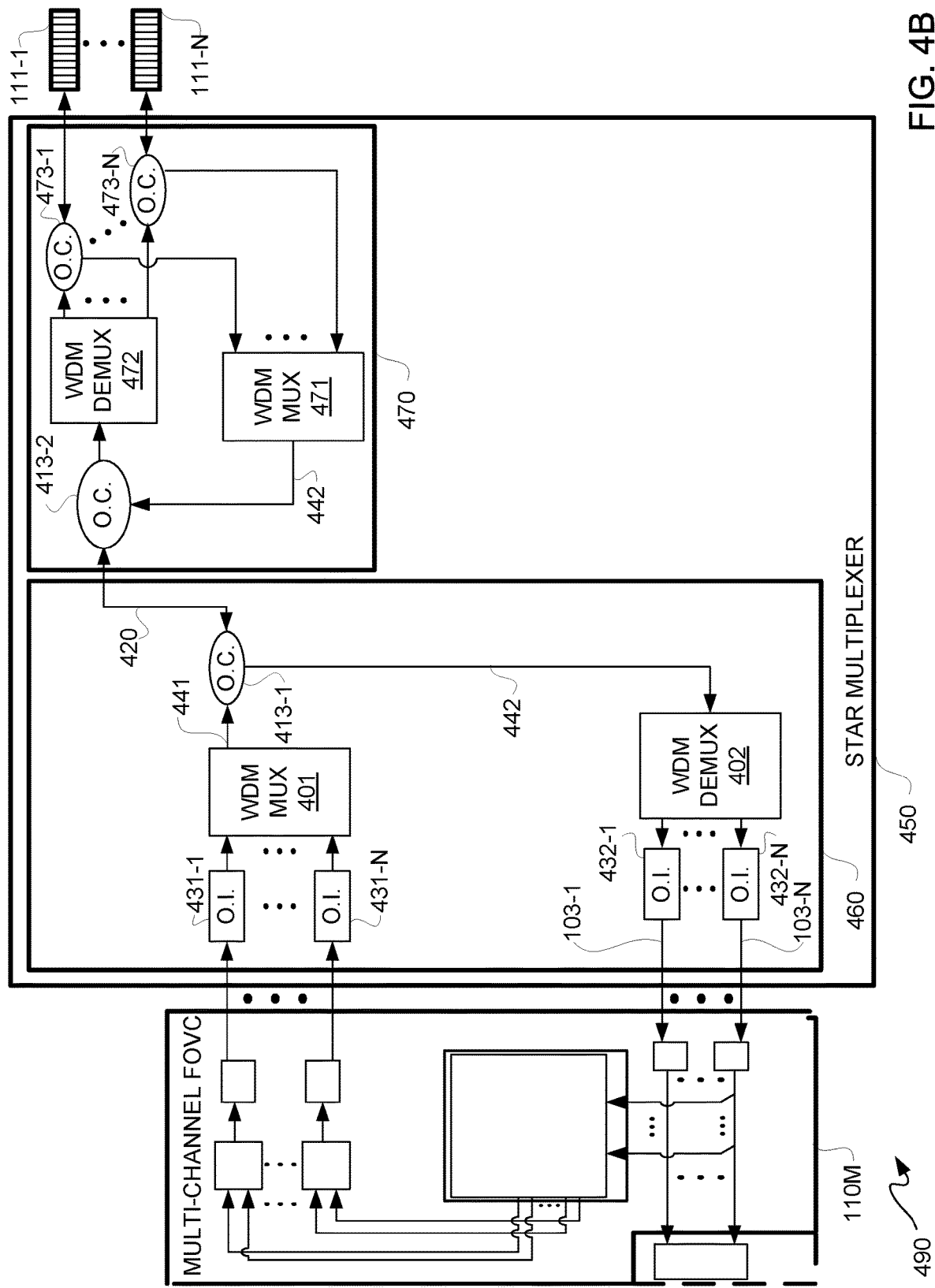
FIG. 4B is a block diagram depicting an exemplary wavelength-multiplexed multichannel FOVC system in a star configuration.

FIG. 4B is a block diagram depicting an exemplary wavelength-multiplexed multichannel FOVC system 490 having a star configuration. Wavelength-multiplexed multichannel FOVC system 490 includes FOVC 110M of FIG. 3, without optical circulators 113-1 through 113-N, coupled to a star multiplexer 450. Wavelength-multiplexed multichannel FOVC system 490 may be used for wavelength-multiplexed N-channel fiber optic voltage conditioning for FOAE measurement configured in a star topology.

FBG sensors 111-1 through 111-N may be FOAE sensors with Bragg reflection wavelengths as previously described. FOVC 110M is coupled as previously described to provide laser light 104-1 through 104-N and to receive returned optical signals 103-1 through 103-N. Accordingly, description of FOVC 110M is generally not repeated for purposes of clarity and not limitation. FOAE measurement may be performed in a reflection mode with N FBG sensors 111-1 through 111-N connected in parallel using N-channel FOVC 110M coupled to a star multiplexer 450 of wavelength-multiplexed multichannel FOVC system 490.

A star multiplexer 450 includes an optical mux/demux device 460 coupled to an optical demux/mux device 470 via an optical cable, such as a bidirectional optical fiber 420. Mux/Demux device 460 includes a WDM mux 401, a WDM demux 402, input optical isolators 431-1 through 431-N, and output optical isolators 432-1 through 432-N, as previously described, except that mux/demux device 460 further includes an optical circulator 413-1 coupled as described below.

WDM mux 401 multiplexes N DFB laser light outputs 104-1 through 104-N into a single-mode multiplexed optical signal 441 for providing to optical circulator 413-1 of optical mux/demux device 460. Such single-mode multiplexed optical signal 441 may be output from optical circulator 413-1 into a single-mode telecommunication optical fiber 420. Optical mux/demux device 460 may be used to multiplex N DFB laser outputs via such an Nx1 multiplexer. Optical circulator 413-1 may be coupled to optical fiber 420 to provide such single-mode multiplexed optical signal 441 to optical demux/mux device 470 and to receive returned light, namely a returned multiplexed optical signal 442. Such a returned multiplexed optical signal 442 may be demultiplexed into N respective photodiode inputs via a 1×N demultiplexer, such as WDM demux 402 as previously described.

Demux/Mux device 470 may be used to demultiplex multiplexed light, such as multiplexed optical signal 441, from mux/demux device 460 into N separate outputs for N FBG sensors 111-1 through 111-N coupled for reflection modes. Along those lines, an optical circulator 413-2 of demux/mux device 470 may be coupled to optical fiber cable 420 to receive multiplexed optical signal 441 for providing to a WDM demux 472 of demux/mux device 470.

Such a 1×N WDM demux 472 may provide N demultiplexed optical signals respectively to optical circulators 473-1 through 473-N of demux/mux device 470. Such demultiplexed optical signals may be respectively provided to such separate FBG sensors 111-1 through 111-N coupled for corresponding reflection modes. FBG sensors 111-1 through 111-N may be externally (as illustratively depicted) or internally coupled to star multiplexer 450.

In response to such demultiplexed optical signals, FBG sensors 111-1 through 111-N may respectively generate reflected returned optical signals to optical circulators 473-1 through 473-N. Optical circulators 473-1 through 473-N may be coupled to WDM mux 471 of demux/mux device 470 to respectively provide such returned light signals from FBG sensors 111-1 through 111-N. WDM mux 471 may multiplex such returned light signals to provide a returned multiplexed optical signal 442 to optical circulator 413-2. Such returned multiplexed optical signal 442 may be provide by optical circulator 413-2 into optical fiber cable 420 for optical circulator 413-1, and optical circulator 413-1 may provide such returned multiplexed optical signal 442 to WDM demux 402 for demultiplexing, as previously described.

In another configuration, mux/demux device 460 may be integrated into FOVC 110M to provide a single optical interface. Along those lines, optical fiber cable 420 and demux/mux device 470 may be used as an external device connected to individual FBG sensors. For long distance measurements, such optical fiber 420 may be replaced by a reflection fiber extender, as previously described herein, to suppress optical noise.

Figure 5:
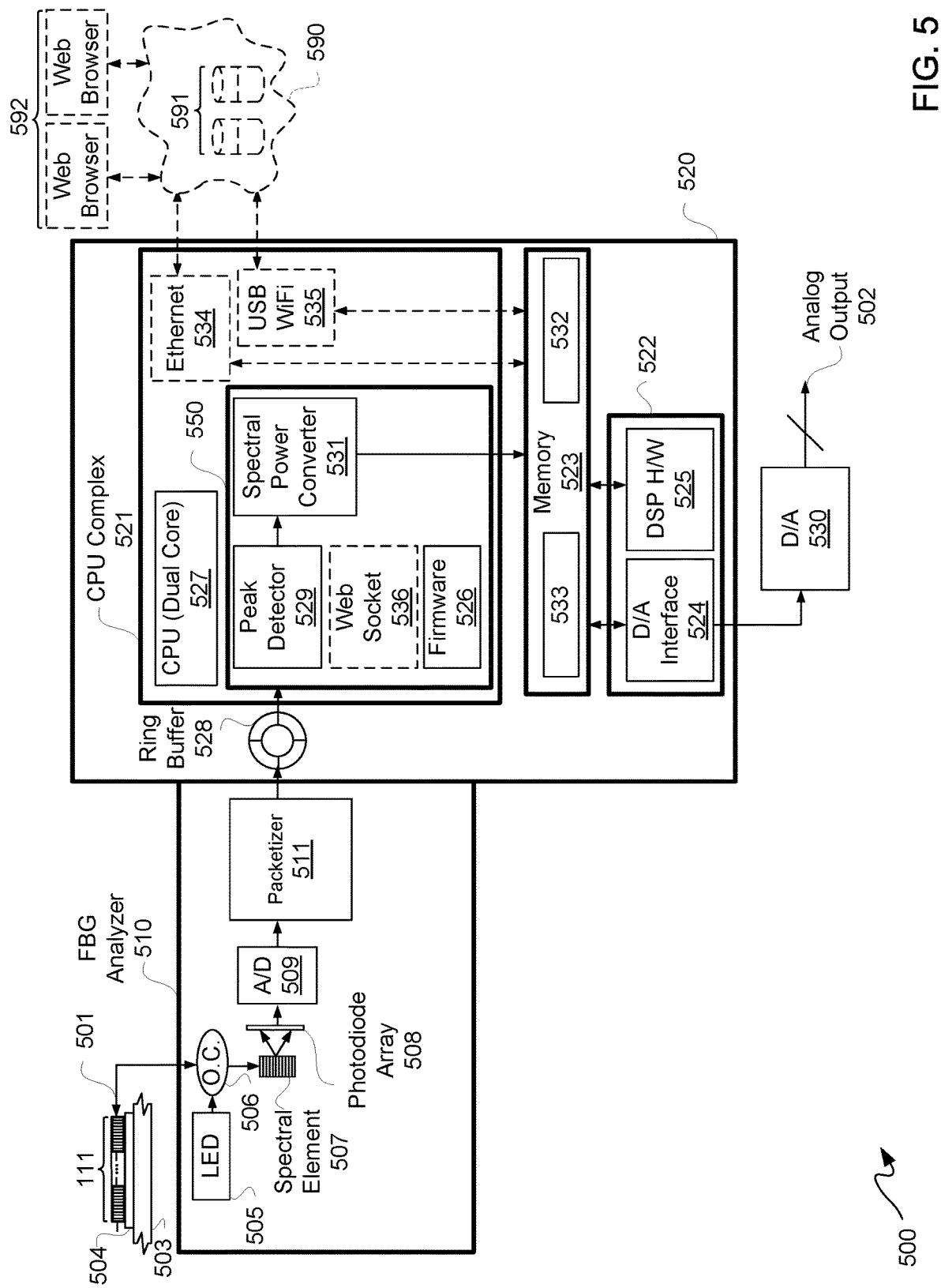
FIG. 5 is a block diagram depicting an exemplary fiber optic strain voltage conditioner system.

FIG. 5 is a block diagram depicting an exemplary fiber optic strain voltage conditioner system 500. Fiber optic strain voltage conditioning ("FOSVC") system 500 may be configured to convert optical signals from FBG sensors 111 into analog voltage outputs 501 that may be directly interfaced with conventional strain instrumentation, as described below in additional detail. Strain-induced wavelength shifts experienced by one or more of FBG sensors 111 may be converted to analog voltage signals ("analog output") 502 that resemble parametric outputs of a conventional strain gauge signal conditioner. This allows FOSVC system 500 to work as a high-performance "drop-in" replacement for a signal conditioner in conventional strain measurement systems, as described below in additional detail.

FOSVC system 500 includes an FBG Analyzer ("FBGA") module 510, a System-on-Chip ("SoC") module 520, FBG sensors 111 in an optical fiber 501, an optical fiber-to-structure bonding material 504, and a digital-to-analog ("D/A") converter 530. Optionally, FOSVC system 500 may be coupled to a network 590, which may include the Internet, for cloud storage 591. Optionally, one or more web-browser enabled devices 592 may be used to communicate with such cloud storage 591 via such network 590.

FBG sensors 111 in an optical fiber 501 housing may be coupled to receive and provide an optical signal via such optical fiber 501, the former of which is for optical transmission of light from broadband light source 505. A bonding material 504 may be used to couple optical fiber 501 of FBG sensors 111 to a material or structure under test 503. A broadband light source 505, such as an LED light source, of FBGA module 510 may provide light to an optical circulator 506 of FBGA module 510, and such light may be sent through to optical fiber 501 via passing through optical circulator 506 through to FBG sensors 111. Responsive to strain-induced wavelength shifts experienced by one or more of FBG sensors 111, any reflected light from FBG sensors 111 may be provided as optical signals via optical fiber 501 to optical circulator 506 for spectral element 507 of FBGA module 510.

Reflected light may be spectrally dispersed through spectral element 507, which in this example is a Volume Phase Grating ("VPG") element 507 of FBGA module 510. Such dispersed light may be detected by a photodiode array 508 of FBGA module 510, which in this example is an Indium Gallium Arsenide (InGaAs) photodiode array; however, other types of photodiode arrays may be used in other implementations. Outputs of photodiode array 508 may be digitized using an analog-to-digital converter ("A/D converter") 509 of FBGA module 510. Output of A/D converter 509 may be packetized by an on-board integrated circuit packetizer 511 of FBGA module 510, which in this example is separate from an FPGA of SoC module 520. However, in another implementation, packetizer 511 and/or A/D converter 509 may be implemented in an FPGA of SoC module 520. Such packetized information may be forwarded from packetizer 511 to SoC module 520 for post-processing.

SoC module 520 may include CPU complex 521, a programmable gate array device 522, and main memory 523. In this example, such programmable gate array device 522 is an FPGA; however, in other implementations, other types of integrated circuits, whether programmable gate array devices or not, may be used to provide a D/A interface 524 and digital signal processing ("DSP") hardware 525.

CPU complex 521, which may be on a same FPGA as D/A interface 524 and DSP hardware 525 in another implementation, in this implementation includes a dual-core CPU 527 running firmware 526. However, a single core or other types of multi-core CPUs may be used in other implementations. Generally, a signal conversion block 550, which may be in CPU complex 521, may include a peak detector 529, a web socket 536, firmware stored in memory ("firmware") 526, and a spectral power converter 531. Firmware 526 may receive data from packetizer 511 of FBGA 510 into a ring buffer 528 of SoC module 520, which may also be of CPU complex 521.

Ring buffer 528 may be used to store a continuous stream of samples from packetizer 511 of FBGA 510 to in effect allow FOSVC system 500 to plot outputs of FBG sensors 111 over a period of time. Firmware 526 may be configured to clean up data from ring buffer 528. Data from ring buffer 528 may be provided to a peak detector 529, and detected peaks may be provided from peak detector 529 to spectral power block 531 to quantify spectral power associated with each of such peaks detected. Along those lines, firmware 526 may quantify wavelength shifts, which are directly proportional to the amount of strain experienced and spectral power sensed by each FBG sensor 111. This post-processed data 532 may be stored in main memory 523.

In this implementation, programmable gate array 522, which is coupled to main memory 523, is configured to provide hardware that reads data 532 that firmware 526 has placed in main memory 523 and that performs signal processing tasks on such data 532 using DSP hardware 525. An example of a signal processing task may be an FFT and/or the like to measure any vibration components in data 532.

Output of DSP hardware 525, such as an FFT output for example, may be written back to main memory 523 as data 533 for use by CPU complex 521. D/A interface 524 of programmable gate array device 522 may be used to send FBG sensor data 532 to an external D/A converter 530 to mimic a parametric output of a conventional strain signal conditioner. FOSVC system 500 may work as a high-performance "drop-in" replacement for a signal conditioner in conventional strain measurement systems, and so analog output 502 may be provided to conventional strain measurement instrumentation (not shown). Each output of D/A converter may represent an output of one FBG sensor of FBG sensors 111.

CPU complex 521 via firmware 526 may be configured to read strain data 533 that programmable gate array 522 has placed in main memory 523. CPU complex 521 may optionally include either or both an Ethernet interface 534 or a USB WiFi interface 535 to forward strain data 533 to one or more remote computers connected over network 590. Optionally, an external cloud server 591 may take outputs from multiple FOSVC systems 500 and store them in a database for further analysis by software running on such cloud server 591. In this example, such computers may include multiple HTML5-compliant Web browsers 592 to communicate with cloud server 591 and/or to communicate with one or more FOSVC systems 500 to access strain data 533, which may allow users to make business decisions and/or configure individual FOSVC systems 500 using corresponding optional Web sockets 536 of CPU complexes 521 of such systems.

Figure 6:
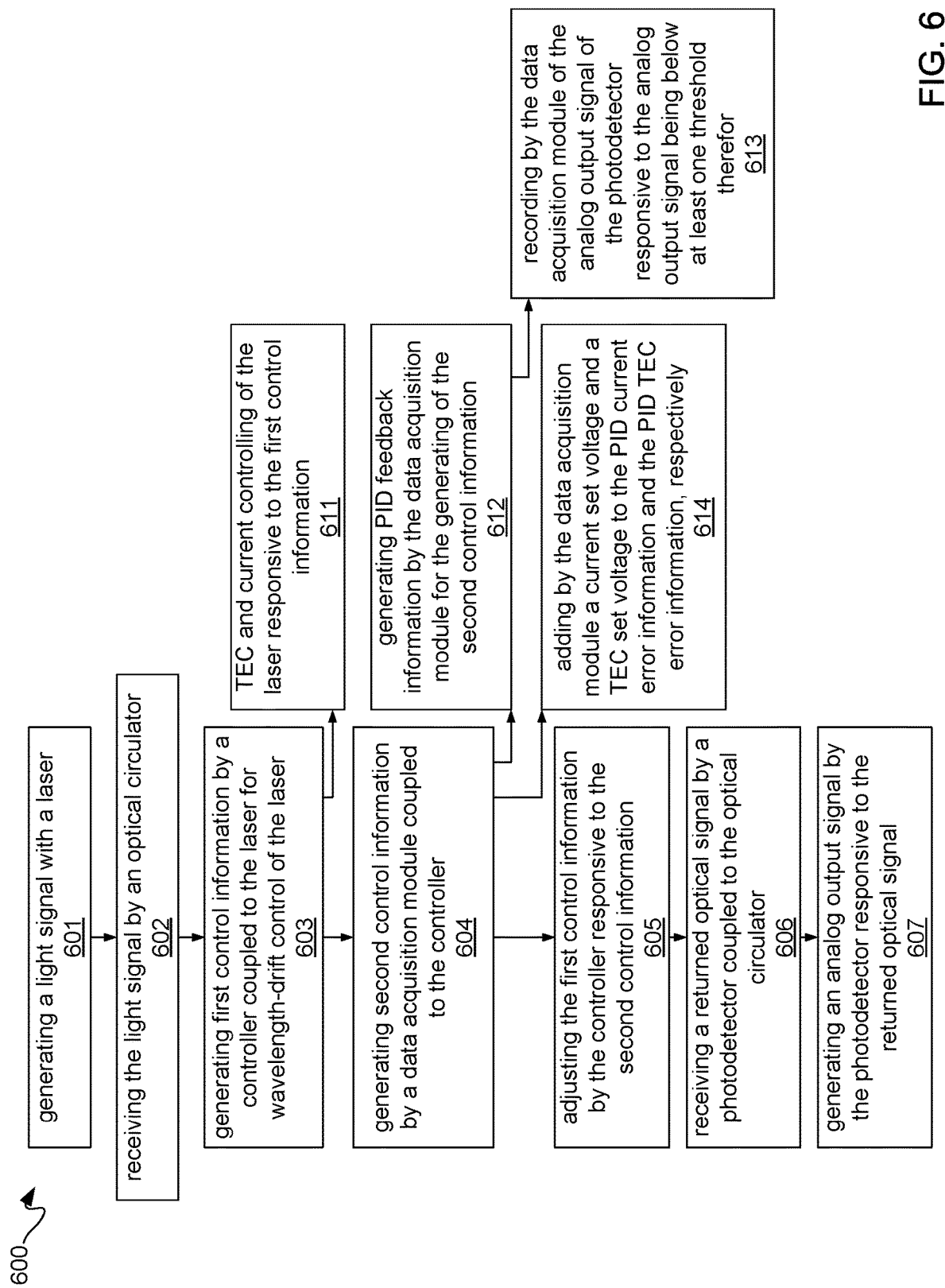
FIG. 6 is a flow diagram depicting an exemplary fiber optic voltage conditioning flow.

FIG. 6 is a flow diagram depicting an exemplary fiber optic voltage conditioning flow 600. Fiber optic voltage conditioning flow 600 is further described in the light of the above-description.

At 601, a light signal may be generated with a laser. At 602, such light signal may be received by an optical circulator. At 603, first control information may be generated by a controller coupled to such laser for wavelength-drift control thereof. At 611, TEC and current controlling of such laser may be responsive to first control information generated at 603. At 604, second control information may be generated by a data acquisition module coupled to such controller. Generating second control information at 604 may include generating PID feedback information at 612 by such data acquisition module. Generating PID feedback information at 612 may include recording at 613 by such data acquisition module of an analog output signal of a photodetector responsive to such analog output signal being below at least one of a gain threshold or a frequency threshold therefor. Moreover, PID feedback information may include PID current error information and PID TEC error information. Along those lines, such data acquisition module may add a current set voltage and a TEC set voltage to such PID current error information and such PID TEC error information, respectively, for generating at 604 such second control information.

At 605, such first control information may be adjusted by such controller responsive to such second control information. Such adjusting of such first control information may be to tune wavelength of a laser for wavelength-drift control of such laser responsive to such second control information. Wavelength-drift control of such laser may be to compensate for drift of a Bragg wavelength.

At 606, a returned optical signal may be received by a photodetector coupled to such optical circulator. At 607, an analog output signal may be generated by such photodetector responsive to such returned optical signal. Such generating by such data acquisition module of such second control information at 604 may be for such analog output signal generated at 607.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored on or transmitted over as one or more instructions or code on a computer-readable medium. The steps of a method or algorithm disclosed herein may be embodied in a processor-executable software module executed which may reside on a non-transitory computer-readable medium. Non-transitory computer-readable media includes any available media that may be accessed by a computer. By way of example, and not limitation, such non-transitory computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable readable medium and/or non-transitory computer-readable medium, which may be incorporated into a computer program product.

The preceding description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the following claims and the principles and novel features disclosed herein. Thus, while the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Any trademarks are the property of their respective owners.

What is claimed is:

1. A system, comprising:
a controller configured to be coupled to a light source and configured to generate first control information for wavelength-drift control of the light source;
a data acquisition module coupled to the controller and configured to generate second control information for the controller for adjustment of the first control information;
a photodetector configured to be coupled to an optical circulator to receive a returned optical signal and coupled to the data acquisition module to provide an output signal thereto;
the photodetector configured to generate the output signal responsive to the returned optical signal;
an acoustic emission data acquisition system coupled to the photodetector for acoustic emission monitoring;
the first control information being for both thermoelectric ("TEC") tracking and current tracking of the light source for the wavelength-drift control for the output signal to provide wavelength-drift compensating for a range from 0 to 20 kHz to provide dynamic strain tracking; and
the data acquisition module configured to generate the second control information using the output signal.

2. The system according to claim 1, wherein the data acquisition module is configured to generate proportional-integral-derivative ("PID") feedback information to generate the second control information.

3. The system according to claim 2, wherein the data acquisition module is configured to record the output signal of the photodetector being below at least one threshold therefor for generation of the PID feedback information.

4. The system according to claim 3, wherein the PID feedback information includes PID current error information and PID TEC error information.

5. The system according to claim 4, wherein the data acquisition module is configured to respectively add a current set voltage and a TEC set voltage to the PID current error information and the PID TEC error information for the generation of the second control information.

6. The system according to claim 1, wherein:
the wavelength-drift control of the light source is to compensate for drift of a Bragg wavelength; and
the second control information is used to adjust the first control information to tune wavelength of the light source for the wavelength-drift control of the light source.

7. The system according to claim 6, wherein the output signal is a first analog output signal, and wherein the acoustic emission data acquisition system is coupled to the photodetector to receive a second analog output signal therefrom.

8. The system according to claim 7, further comprising a plurality of photodetectors and a plurality of controllers coupled to the acoustic emission data acquisition system and configured to generate multi-channel fiber optic voltage conditioning.

9. A method for fiber optic voltage conditioning, comprising:
generating first control information by a controller responsive to a light source for wavelength-drift control thereof;
generating second control information by a data acquisition module coupled to the controller;
adjusting the first control information by the controller responsive to the second control information;
receiving a returned optical signal by a photodetector;
generating an output signal by the photodetector responsive to the returned optical signal;
monitoring for acoustic emission by an acoustic emission data acquisition system coupled to the photodetector; and
thermoelectric ("TEC") and current tracking of the light source responsive to the first control information including for the wavelength-drift control for the output signal to provide wavelength-drift compensating for a range from 0 to 20 kHz and to provide dynamic strain tracking, respectively.

10. The method according to claim 9, wherein the generating by the data acquisition module of the second control information is for the output signal, the method further comprising:
generating proportional-integral-derivative ("PID") feedback information by the data acquisition module for the generating of the second control information; and
wherein the generating of the PID feedback information comprises recording by the data acquisition module of the output signal of the photodetector responsive to the output signal being below at least one threshold therefor.

11. The method according to claim 10, wherein the PID feedback information includes PID current error information and PID TEC error information.

12. The method according to claim 11, further comprising adding by the data acquisition module a current set voltage and a TEC set voltage to the PID current error information and the PID TEC error information, respectively, for the generating of the second control information.

13. The method according to claim 9, wherein the wavelength-drift control of the light source is to compensate for drift of a Bragg wavelength.

14. The method according to claim 13, wherein the adjusting of the first control information is to tune wavelength of the light source for the wavelength-drift control of the light source responsive to the second control information.

15. A system, comprising:
a photodiode array coupled to receive spectrally dispersed light and configured to detect the spectrally dispersed light for conversion into analog signaling;
an analog-to-digital converter coupled to receive the analog signaling and configured to convert the analog signaling into digital signaling;
a system-on-chip module coupled to receive the digital signaling and configured with a peak detector to detect peaks and a spectral power converter to quantify spectral power associated with each of the detected peaks; and the system-on-chip module configured to quantify wavelength shifts associated the spectral power quantified to provide strain data.

16. The system according to claim 15, wherein the system-on-chip module comprises digital signal processing circuitry configured to perform a Fast Fourier Transform on the strain data to provide vibration components in the strain data.

17. The system according to claim 15, further comprising a digital-to-analog converter coupled to receive and convert the strain data from a digital format to an analog format.

* * * * *